United States Patent
Yi et al.

(10) Patent No.: US 8,269,901 B2
(45) Date of Patent: Sep. 18, 2012

(54) DIGITAL BROADCASTING RECEIVER AND ONE-TOUCH CHANNEL SETTING METHOD

(75) Inventors: Ho Yi, Seongnam-si (KR); Seung-Kwan Ha, Seoul (KR); Jun-Hyung Kim, Seongnam-si (KR)

(73) Assignee: Humax Co., Ltd., Seongnam-Si (KR)

( * ) Notice: Subject to any disclaimer, the term of this patent is extended or adjusted under 35 U.S.C. 154(b) by 1341 days.

(21) Appl. No.: 11/872,149

(22) Filed: Oct. 15, 2007

(65) Prior Publication Data
US 2008/0129885 A1    Jun. 5, 2008

(30) Foreign Application Priority Data

Dec. 5, 2006 (KR) .................. 10-2006-0121905

(51) Int. Cl.
*H04N 5/50* (2006.01)
*H04N 7/20* (2006.01)

(52) U.S. Cl. ........... 348/731; 348/570; 348/732; 725/68

(58) Field of Classification Search .................. 348/570, 348/731–732; 725/68
See application file for complete search history.

(56) References Cited

U.S. PATENT DOCUMENTS

| | | | |
|---|---|---|---|
| 6,980,529 B1* | 12/2005 | Arsenault | 370/316 |
| 7,085,529 B1* | 8/2006 | Arsenault et al. | 455/3.02 |
| 7,240,357 B1* | 7/2007 | Arsenault et al. | 725/68 |
| 7,697,078 B2* | 4/2010 | Onomatsu et al. | 348/731 |
| 7,929,062 B2* | 4/2011 | Oh | 348/732 |
| 2004/0093617 A1 | 5/2004 | Horr et al. | 725/71 |
| 2005/0124289 A1* | 6/2005 | Coffin, III | 455/3.02 |
| 2005/0283808 A1* | 12/2005 | Quere et al. | 725/68 |
| 2006/0038926 A1* | 2/2006 | Mayer et al. | 348/731 |

FOREIGN PATENT DOCUMENTS

EP    1 596 465 B1    11/2006

OTHER PUBLICATIONS

European Search Report dated Dec. 11, 2008.

* cited by examiner

*Primary Examiner* — Kristine Kincaid
*Assistant Examiner* — Gigi L Dubasky
(74) *Attorney, Agent, or Firm* — KED & Associates LLP

(57) ABSTRACT

A digital broadcast receiver and a one-touch channel setting method are disclosed. In order to set channels, the digital broadcast receiver tunes a tuner corresponding to an applied channel setting value chosen from available channel setting values that are made from combinations of channel setting value factors by referencing a transponder list corresponding to the applied channel setting value, and sets an antenna and a tuner to correspond with the applied channel setting value in accordance with the tuning result. Thus, the antenna and tuner may be set automatically for searching channels.

13 Claims, 8 Drawing Sheets

PRIOR ART

FIG. 2

```
    Factors for channel setting
(1) satellite name → {Hotbird, Astra, Uilesat, ...}
(2) LNB frequency → {Universal, 10600, ...}
(3) DiSEqC switch input value → {A,B,C,D, ...}
(4) 22 Khz tone → {On, Off}
(5) Tuner → {1,2,3, ...}
```

FIG. 3

| Satellite 1 |
|:---:|
| CH 11 |
| CH 12 |
| . |
| . |
| . |
| CH 1L |

FIG. 5

| Satellite 1 | TP 1 |
|---|---|
| CH 111 CH 112 CH 113 ⋮ CH 11L | |

US 8,269,901 B2

DIGITAL BROADCASTING RECEIVER AND ONE-TOUCH CHANNEL SETTING METHOD

CROSS-REFERENCE TO RELATED APPLICATIONS

This application claims the benefit of Korean Patent Application No. 10-2006-0121905 filed with the Korean Intellectual Property Office on Dec. 5, 2006, the disclosure of which is incorporated herein by reference in its entirety.

BACKGROUND

1. Technical Field

The present invention relates to channel setting, more particularly to a digital broadcast receiver and a one-touch channel setting method.

2. Description of the Related Art

In general, a digital broadcasting receiver is equipped with a personal video recording function, for recording and saving a digital broadcast receiver on a recording medium such as a hard disk, and is connected to a digital broadcast antenna and television. The digital broadcast receiver may also use multiple tuners, to allow a user viewing one channel to view another channel using the picture-in-picture (PIP) function or to record another channel.

Also, the digital broadcasting receiver has a channel search function, which is the first function to be activated after the user purchases the digital broadcast receiver, and which is activated periodically during use to re-register channel information if it is changed.

FIG. 1 is a flowchart illustrating general procedures of searching channels for a digital broadcast receiver equipped with multiple tuners.

Referring to FIG. 1, the digital broadcast receiver first displays a UI screen, in operation 110, for receiving channel setting conditions from the user as input.

In operation 120, the digital broadcast receiver sets the antenna according to one or more inputs made through the UI screen regarding setting conditions for the antenna, such as satellite information (e.g. satellite name, etc.), LNB information (e.g. LNB frequency, voltage, etc.), the use of 22 KHz tone (on/off), and DiSEqC switch value, etc.

After setting the antenna, in operation 130, the digital broadcast receiver has to select which tuner the antenna is connected to, from among multiple tuners, which is referred to as "tuner selection."

In operation 140, after the tuner selection, the digital broadcast receiver performs a "channel search" using information on the transponder (TP) to be searched.

In operation 150, the digital broadcast receiver determines whether or not the channel search has been performed successfully. If the channel search is not performed, this means that one or more of the antenna setting conditions and the selected tuner have been set incorrectly, so the digital broadcast receiver returns to operation 110 and notifies that the channel search has failed, and displays the UI screen to receive a new command as input.

In the past, the user had to provide input manually in the installing process, for setting the antenna and selecting the tuner, and as it is difficult for a general user to understand the input conditions for the tuner, the user typically had to depend on an installation technician or installation expert to install the digital broadcast receiver. This incurred extra costs and time consumption, and there was also the inconvenience not only of having to perform the installation procedures at the time of purchase of the digital broadcast receiver but also of having to repeat them every time a new channel was to be added.

SUMMARY

An aspect of the invention is to provide a digital broadcast receiver and one-touch channel setting method which allow automatic antenna setting and tuner selection without additional user input.

One aspect of the invention provides a one-touch channel setting method, by which to set channels in a digital broadcast receiver, which includes: tuning a tuner corresponding to an applied channel setting value chosen from available channel setting values made from combinations of channel setting value factors by referencing a transponder list corresponding to the applied channel setting value, and setting an antenna and a tuner to correspond with the applied channel setting value in accordance with the tuning result.

Here, the tuning may include producing available channel setting values from combinations of channel setting value factors, choosing an applied channel setting value from the available channel setting values, and tuning a tuner corresponding to the applied channel setting value by referencing a transponder list of a satellite corresponding to the chosen applied channel setting value.

Also, the setting may include determining whether or not the tuned signal of the transponder from the transponder list matches pre-stored signal information of a transponder corresponding to the satellite, if the tuning is successful, and setting the antenna and the tuner to correspond with the applied channel setting value, only if the determination result indicates a match, and if there is no match, the method may proceed to the tuning again with the applied channel setting value removed.

In addition, if the tuning is unsuccessful, the method may proceed to the tuning again with the applied channel setting value removed.

Here, the determining of whether or not the tuned signal of the transponder from the transponder list matches pre-stored signal information of a transponder corresponding to the satellite may be performed by comparing the PSI/SI data of the stored transponder signal information and the signal of the transponder.

The PSI/SI data of the stored transponder signal information and the signal of the transponder may be pre-stored in the digital broadcast receiver.

Also, the available channel setting value may be produced to correspond to channel setting value factors including satellite information, LNB information, and tuner information. Here, satellite information may be the names of satellites that the digital broadcast receiver is able to support, LNB information may be LNB frequency values, LNB voltage values, etc., and tuner information may be the number of tuners that the digital broadcast receiver has.

In addition, the channel setting value factors may further include DiSEqC switch value and whether or not 22 KHz tone is used.

Here, the tuning may be repeated for the number of all possible combinations of the available channel setting values. The number of all possible combinations may be calculated, for example, by multiplying the number of satellite information, the number of LNB information, the number of DiSEqC switch values, the number of possible cases on whether or not 22 KHz tone is used, and the number of tuners. Here, if any one combination of antenna and tuner is set, the tuning may be repeated after excluding other channel setting values that have the same tuner information and DiSEqC switch input value as those of the set available channel setting value.

Furthermore, if the digital broadcast receiver has a plurality of tuners, each tuner may be tuned simultaneously in the tuning, using a different applied channel setting value.

Another aspect of the invention relates to a digital broadcast receiver that includes: a tuner unit, which has one or more tuners and which tunes a signal inputted from an antenna; a control unit, which tunes a tuner corresponding to an applied channel setting value chosen from available channel setting values that are made from combinations of channel setting value factors by referencing a transponder list corresponding to the applied channel setting value, and which sets an antenna and a tuner to correspond with the applied channel setting value in accordance with the tuning result; and a channel information storage unit, which processes the signal of a transponder tuned by the tuner and stores it as channel information.

Here, the control unit may produce available channel setting values from combinations of channel setting value factors, choose an applied channel setting value from the available channel setting values, and tune a tuner corresponding to the applied channel setting value by referencing a transponder list of a satellite corresponding to the chosen applied channel setting value.

Also, the control unit may, determine whether or not the tuned signal of the transponder from the transponder list matches pre-stored signal information of a transponder corresponding to the satellite, if the tuning is successful; set the antenna and the tuner to correspond with the applied channel setting value, only if the determination result indicates a match, and repeat the channel setting procedure with the applied channel setting value removed, if there is no match; and repeat the channel setting procedure with the applied channel setting value removed, if the tuning is unsuccessful.

Here, the available channel setting value may be produced to correspond to channel setting value factors including satellite information, LNB information, and tuner information. The satellite information may be the names of satellites that the digital broadcast receiver is able to support, LNB information may be LNB frequency values, LNB voltage values, etc., and tuner information may be the number of tuners that the digital broadcast receiver has.

The channel setting value factors may further include DiSEqC switch value and whether or not 22 KHz tone is used.

Also, the channel setting procedure may be repeated for the number of all possible combinations of the available channel setting values, the number of which may be calculated, for example, by multiplying the number of satellite information, the number of LNB information, the number of DiSEqC switch values, the number of possible cases on whether or not 22 KHz tone is used, and the number of tuners. If any one combination of antenna and tuner is set, the tuning may be repeated after excluding other channel setting values that have the same tuner information and DiSEqC switch input value as those of the set available channel setting value.

Determining whether or not the tuned signal of the transponder from the transponder list matches pre-stored signal information of a transponder corresponding to the satellite may be performed by comparing the PSI/SI data of the stored transponder signal information and the signal of the transponder, and the digital broadcast receiver may further include a transponder information storage unit which stores the PSI/SI data of the signal of the transponder and the transponder list.

In addition, if the digital broadcast receiver has a plurality of tuners, each tuner may be tuned simultaneously in the tuning, using a different applied channel setting value.

Additional aspects and advantages of the present invention will be set forth in part in the description which follows, and in part will be obvious from the description, or may be learned by practice of the invention.

BRIEF DESCRIPTION OF THE DRAWINGS

FIG. 2 is a chart illustrating the factors of available channel setting values according to an embodiment of the invention.

FIG. 3, FIG. 4, and FIG. 5 illustrate menu lists within a satellite connected to a digital broadcast receiver.

DETAILED DESCRIPTION

Figure 1:
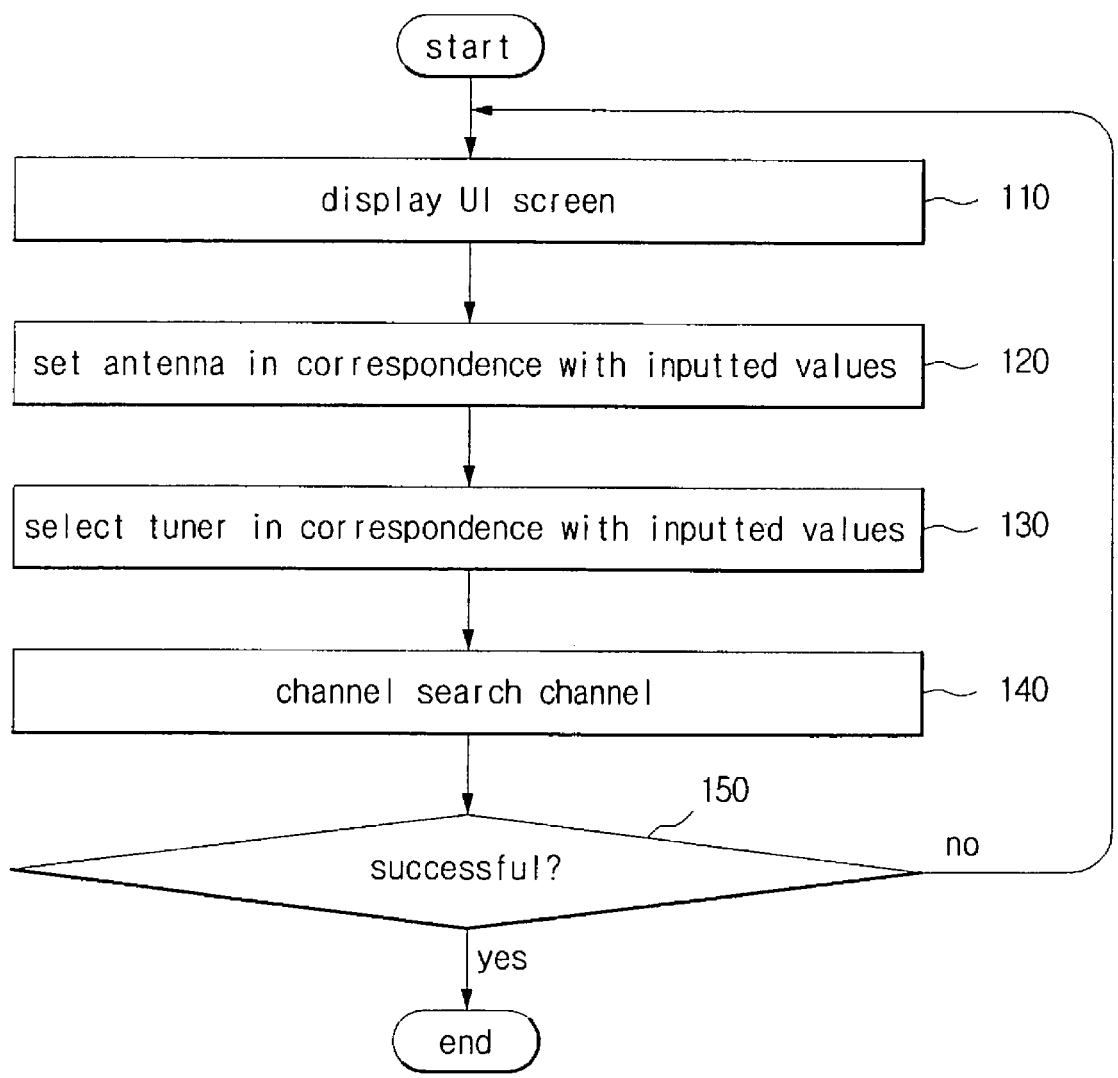
FIG. 1 is a flowchart illustrating general procedures of searching channels for a digital broadcast receiver equipped with multiple tuners.

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

While terms including ordinal numbers, such as "first" and "second," etc., may be used to describe various components, such components are not limited to the above terms. The above terms are used only to distinguish one component from another. For example, a first component may be referred to as a second component without departing from the scope of rights of the present invention, and likewise a second component may be referred to as a first component. The term "and/or" encompasses both combinations of the plurality of related items disclosed and any one item from among the plurality of related items disclosed.

When a component is mentioned to be "connected" to or "accessing" another component, this may mean that it is directly connected to or accessing the other component, but it is to be understood that another component may exist in-between. On the other hand, when a component is mentioned to be "directly connected" to or "directly accessing" another component, it is to be understood that there are no other components in-between.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have the meanings equal to the contextual meanings in the relevant field of art, and are not to be interpreted to have ideal or excessively formal meanings unless clearly defined in the present specification.

Certain embodiments of the invention will be described below in more detail with reference to the accompanying drawings, in which those components are rendered the same reference numeral that are the same or are in correspondence, regardless of the figure number, and redundant explanations are omitted.

FIG. 2 is a chart illustrating the factors of available channel setting values according to an embodiment of the invention.

Referring to FIG. 2, factors that form the channel setting values in certain embodiments of the invention may be divided mainly into conditions required for setting the antenna and conditions required for tuner selection.

In this embodiment, the conditions for antenna setting include satellite information and LNB (low-noise block converter) information, etc. As described above, satellite information may include satellite names, while LNB information may include LNB frequency values and LNB voltage values, etc.

Here, the LNB may serve to convert the high frequencies, of about 4 to 12 GHz, transmitted from satellites to intermediate frequencies, of about 1 GHz, and may be positioned at the center of the antenna.

Also, DiSEqC switch input values and whether or not 22 KHz tone is used (on/off), etc., may be included as antenna setting conditions. Of course, the embodiment is not limited to the above factors, and it is apparent to those skilled in the art that factors may be added or omitted later.

Here, the DiSEqC switch is a device which automatically chooses an antenna when there are several antennas. One DiSEqC switch may typically be made with two ports or four ports, and can thus accommodate up to two or four satellite antennas. Here, a DiSEqC switch input value corresponds to a value representing each port.

Also, 22 KHz tone may be chosen from a use (on) mode or a non-use (off) mode.

Tuner selection refers to selecting which tuner the antenna is connected to, when there are multiple tuners.

In this specification, each combination of channel setting factors, such as the satellite information, LNB information, use of 22 KHz tone, DiSEqC switch input value, and tuner, etc., described above, will be referred to as a "channel setting value". For example, the antenna may be set with the conditions of using koreasat for the satellite name, 10600 MHz for the LNB frequency, port A selected for the DiSEqC switch input value, and not using 22 KHz tone, while the antenna thus set may be set to be connected to the first tuner, to produce a channel setting value.

Figure 3:
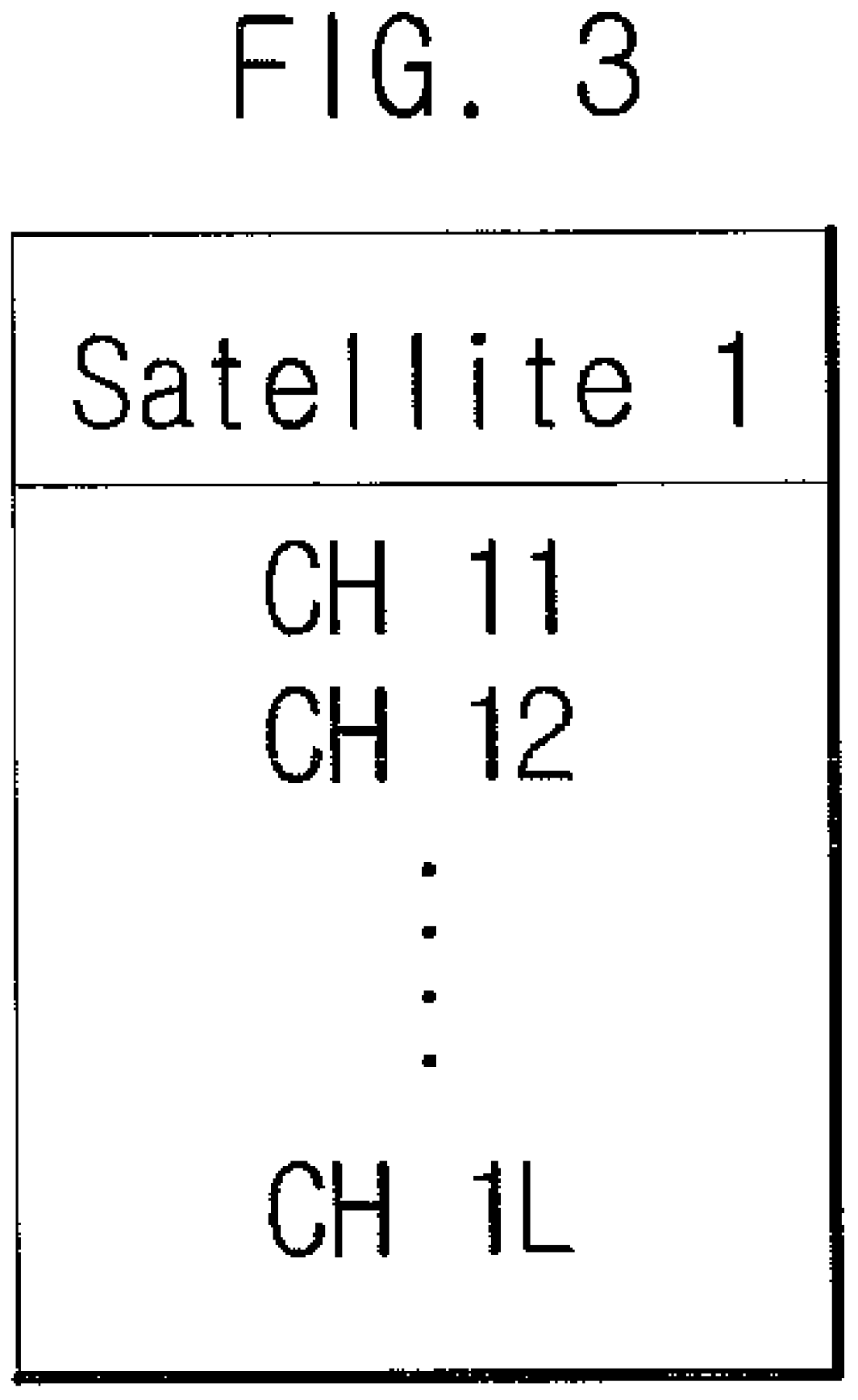
Figure 4:
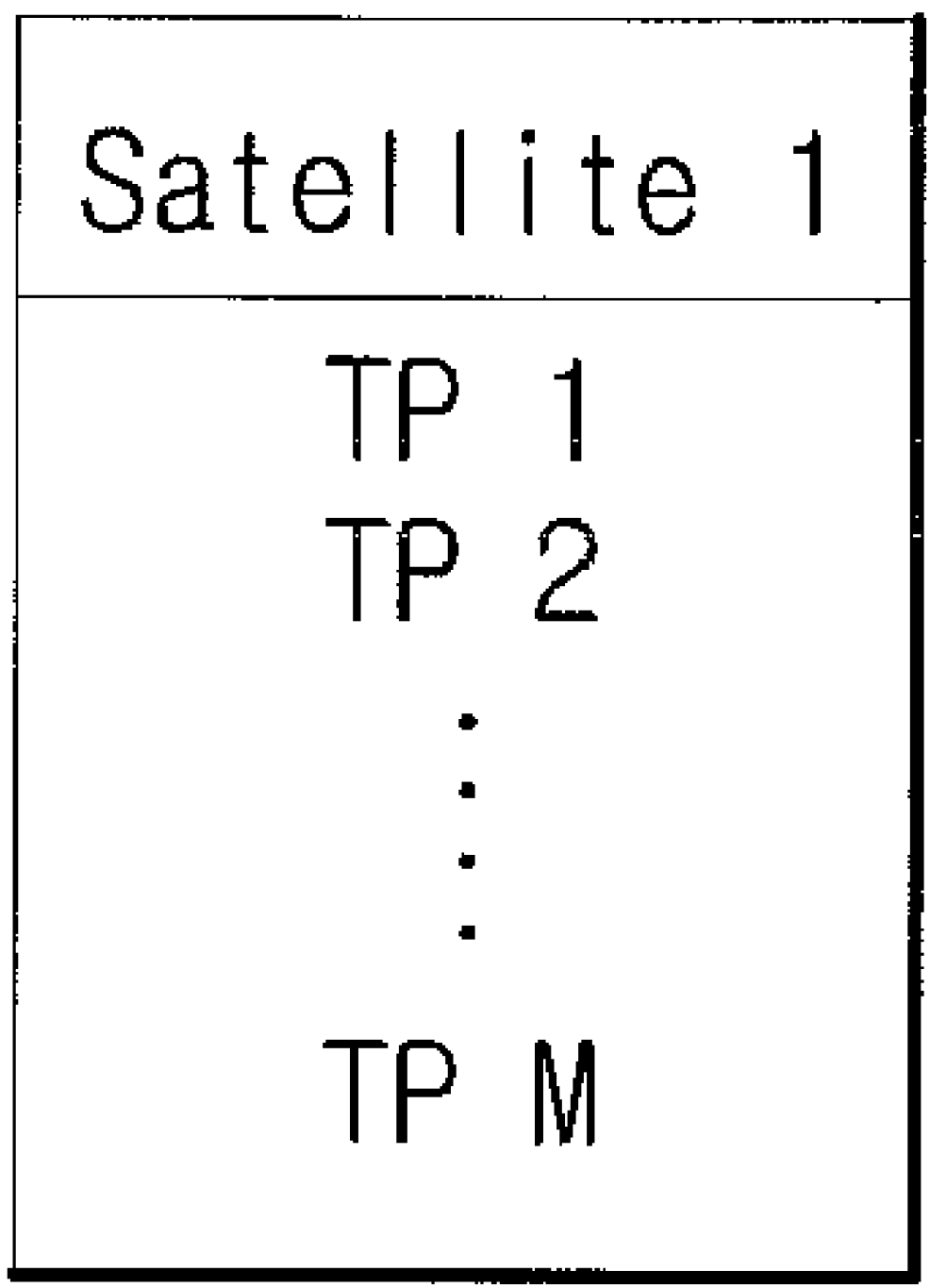
Figure 5:
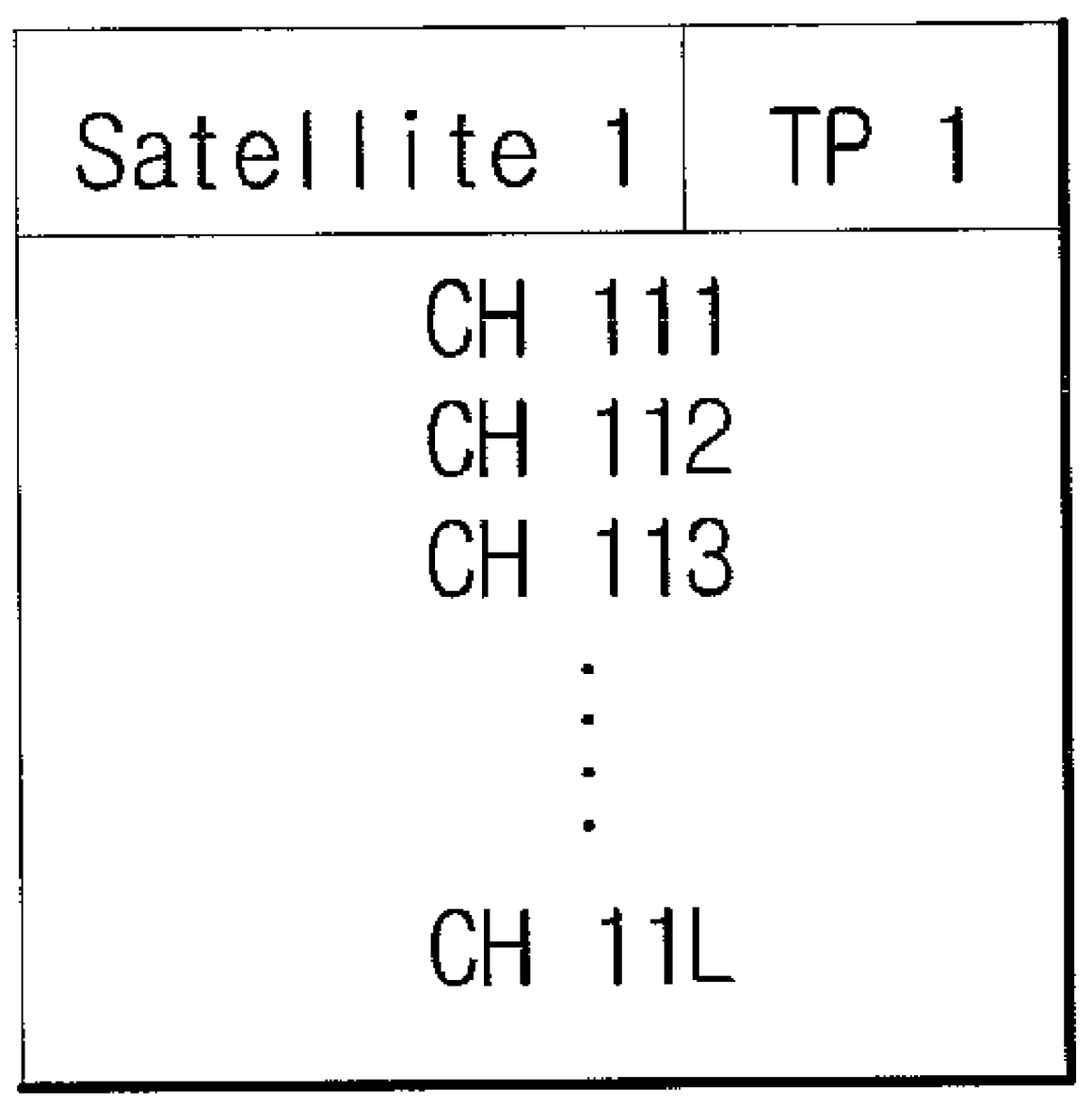

FIGS. 3 to 5 illustrate menu lists within a satellite connected to a digital broadcast receiver.

Referring to FIGS. 3 to 5, each satellite may have one or more transponders (TP). The transponder is a satellite relay device, which receives communications transmitted from a ground broadcast station, amplifies them within the satellite, and then retransmits them to the ground. Each transponder may typically relay a plurality of channels. While the group of multiple channels relayed by a transponder may carry the same signal characteristics, referred to as transponder information, different transponders may carry different transponder information, even within the same satellite.

Here, transponder information relates to the signal characteristics of a transponder, and may include one or more of frequency, frequency, symbol rate, FEC (forward error correction) value, and polarization, etc.

Each satellite that relays digital satellite broadcast signals typically has dozens of transponders installed, which may be referred to in a transponder list. While there is no limit on the number, several to several tens of channels may be set in a transponder, within a range allowed by the data transmission rate for the transmitted signals. By way of the multiple channels set as described above, a variety of digital satellite broadcast signals may be received by the digital broadcast receiver.

Within the digital broadcast receiver, the satellite broadcast information may be managed and operated for each satellite, where the sub-items related to satellite 1 from among the plurality of satellites may be, for example, composed of channels (CH 11-CH 1L) as illustrated in FIG. 3, or composed of transponders (TP 1-TP M) included in satellite 1, as illustrated in FIG. 4. Also, the sub-items of TP 1 may, as illustrated in FIG. 5, be composed of channels (CH 111-CH 11L) included in TP 1.

Figure 6:
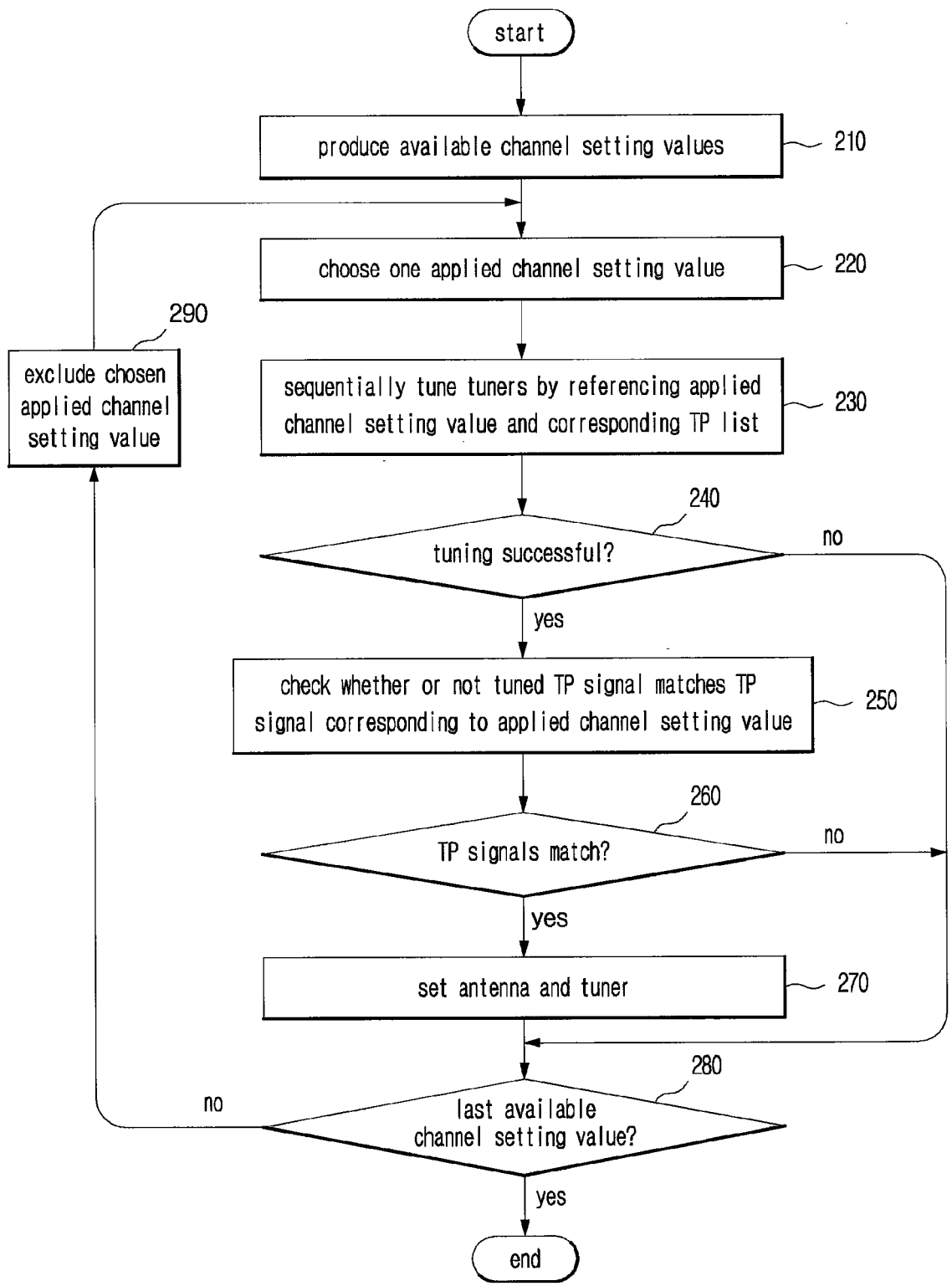
FIG. 6 is a flowchart illustrating a one-touch channel setting procedure in a digital broadcast receiver according to an embodiment of the invention.

FIG. 6 is a flowchart illustrating a one-touch channel setting procedure in a digital broadcast receiver according to an embodiment of the invention.

Referring to FIG. 6, when a particular key is inputted according to a one-touch channel setting function activation command, the digital broadcast receiver, in operation 210, may produce combinable channel setting values using the channel setting factors.

Here, the channel setting values may vary according to how each of the conditions is combined. As an example, assume that the maximum number of satellites supported by the digital broadcast receiver is K, the maximum number of LNB frequencies is L, the maximum number of DiSEqC switch input values is M, the possible number of cases on whether or not 22 KHz tone is used is 2 (on or off), and the maximum number of tuners equipped in the digital broadcast receiver is N. Then, the maximum number of combinations for the channel setting values may be K×L×M×2×N.

In this specification, such possible combinations for channel setting values will be referred to as "available channel setting values". Thus, as described above, the number of available channel setting values may be K×L×M×2×N.

In operation 220, the digital broadcast receiver may choose an applied channel setting value from among the available channel setting values produced. Here, the term "applied channel setting value" used in certain embodiments of the invention has been coined for convenient description, and refers to a channel setting value that has been chosen for tuning from among the available channel setting values.

After all possible combinations of available channel setting values are produced using the factors for channel setting in operation 210 described above, operation 220 may be proceeded with. Of course, it is possible to produce just one available channel setting value and use it as the applied channel setting value.

In operation 230, the digital broadcast receiver may tune the tuner corresponding to the applied channel setting value, by referencing the transponder list of the satellite corresponding to the chosen applied channel setting value. Here, one satellite and one tuner may be selected from a channel setting value.

As described above, the transponder list refers to the collection of each transponder, and each transponder may have different transponder information. Therefore, a tuner equipped in the digital broadcast receiver may be tuned by sequentially receiving as input each of the transponder information of the transponder list corresponding to the satellite selected when setting the antenna.

Afterwards, in operation 240, the digital broadcast receiver may determine whether or not the tuning using each of the transponder information of the transponder list is successful. This may be performed by having the digital broadcast receiver attempt tuning for all transponder information on the transponder list for the satellite that corresponds to the applied channel setting value and then produce the transponder information for which tuning is successful, and afterwards proceed to operation 250 with the successful transponder information.

Alternately, the digital broadcast receiver may sequentially determine whether or not tuning is successful for each of the transponder information, and if one transponder information leads to a successful tuning, the digital broadcast receiver may proceed immediately to operation 250. Although it is not illustrated in detail in FIG. 6, if it is determined in operation 250 that the currently tuned transponder information is not a signal of the satellite corresponding to the applied channel setting value, the digital broadcast receiver may repeat operation 240 using the remaining transponder information of the transponder list corresponding to the satellite corresponding to the applied channel setting value.

If the results of operation 240 show that tuning is not successful for any of the transponder information of the transponder list corresponding to the satellite selected during the antenna setting, the digital broadcast receiver may first determine whether or not the current applied channel setting value is the last one of the available channel setting values.

If it is the last one, the channel setting procedure may be ended, but if it is not the last one, the digital broadcast receiver may, in operation 290, repeat the channel setting procedure by removing the applied channel setting value and choosing another applied channel setting value from among the remaining available channel setting values.

If the results of operation 240 show that tuning is successful for a transponder information, the digital broadcast receiver may check in operation 250 whether or not the signal tuned according to the applied channel setting value matches the signal information of the actual corresponding transponder. Here, it is assumed that the signal information of the transponder is pre-stored in the digital broadcast receiver.

This may be performed by determining whether or not the signal outputted as a result of the tuning is the same signal as the PSI data, as defined by ISO/IEC 13181-1, or the SI data, as defined by ETSI EN 300 468, of the transport stream of the actual transponder.

Here, PSI is program specific information involving tables for controlling a program transmitted using an MPEG-2 transport stream. PSI is defined in ISO/IEC 13818-1, while SI is defined in ETSI EN 300 468.

One of the reasons for checking whether or not the tuned signal is really a signal of a transponder of the satellite corresponding to the applied channel setting value may be that, with greater numbers of transponders on the satellites, there may be occasions where there is overlapping tuning information (frequency, symbol rate, FEC, polarization, etc.) between satellites within the general input frequency range for tuners of around 950 to 2150 MHz. In other words, it may be to prevent those cases where tuning is successful for a signal that is not in fact a signal of a transponder of a satellite corresponding to the applied channel setting value, which results in incorrect antenna setting and tuner selection.

If it is determined, by the result of the checking in operation 260, that the tuned signal of the transponder matches the stored transponder signal information, the digital broadcast receiver sets the antenna and selects the tuner in operation 270 according to the applied channel setting value. That is, the channel setting is completed according to the channel setting value of interest. Thus, with this embodiment, channel setting may be performed without additional input from the user.

If the tuned signal of the transponder and the stored transponder signal information do not actually match, the process may proceed to operation 280 as illustrated in FIG. 6.

In operation 280, the digital broadcast receiver may check whether the channel setting procedure has been attempted for all of the available channel setting values. If there is still an available channel setting value remaining for which tuning has not been attempted, the digital broadcast receiver may return from operation 290 to operation 220, whereas if tuning attempts have been made up to the last available channel setting value, the one-touch channel setting procedure may be ended.

It is apparent to those skilled in the art that a channel searching procedure may follow, in which channels corresponding to the received satellite signal are searched and stored.

In a product having two or more tuners, a procedure may be performed for setting channels by tuning each tuner simultaneously using a different applied channel setting value. This may provide the advantage that the time required for channel setting may be reduced overall compared to performing the channel setting procedure sequentially for each tuner.

Of course, when attempting simultaneous tuning in multiple tuners, it is apparent that each tuner may be controlled not to use the same applied channel setting value, and that the applied channel setting value used in one tuner may be excluded from use in another tuner.

As presented above, according to this embodiment, a user is able to complete the antenna setting and tuner selection of the digital broadcast receiver with just one key input. This is described in this specification as a one-touch method. That is, the user can complete the channel setting procedure by inputting a command just once, and this one-touch method of setting channels can thus increase convenience.

Figure 7:
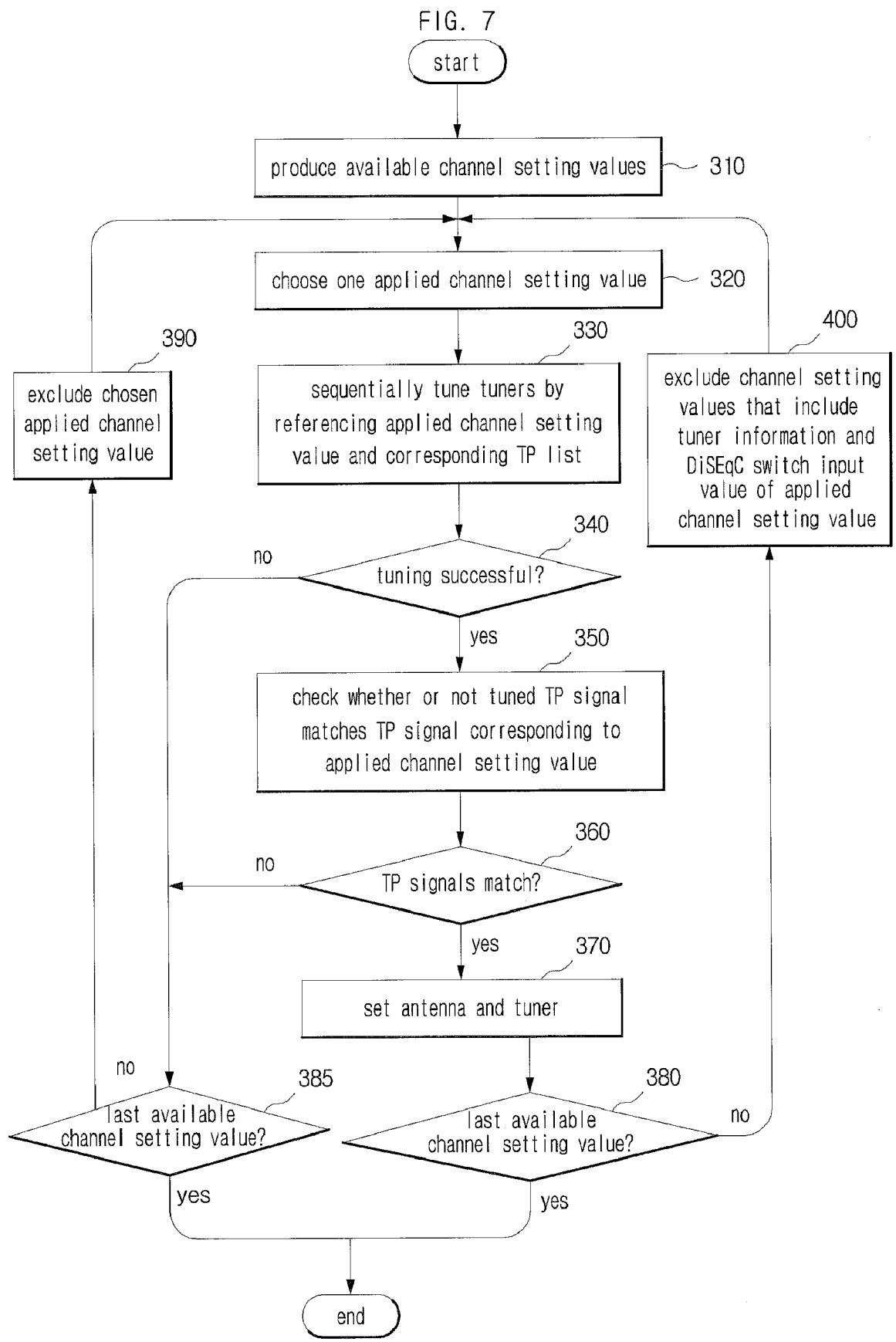
FIG. 7 is a flowchart illustrating a one-touch channel setting procedure in a digital broadcast receiver according to another embodiment of the invention.

FIG. 7 is a flowchart illustrating a one-touch channel setting procedure in a digital broadcast receiver according to another embodiment of the invention.

In FIG. 7, operations 310 to 390 are in correspondence with operations 210 to 290 of FIG. 6, and thus will not be described in further detail. However, it should be noted that operation 280 of FIG. 6 is in correspondence with operation 380 and operation 385 of FIG. 7.

Unlike the embodiment described with reference to FIG. 6, in the digital broadcast receiver according to this embodiment, if the antenna and tuner are set according to one applied channel setting value, those channel setting values that have the same tuner information and DiSEqC switch input value as the applied channel setting value, from among the remaining available channel setting values, may be excluded from being candidates for applied channel setting values, i.e. excluded from the tuning.

To be more specific, if the applied channel setting value with which the antenna and tuner are set is not the last one of the channel setting values, the digital broadcast receiver may, in operation 400, exclude all of the other available channel setting values that have the same tuner information and DiSEqC switch input value as the set channel setting value and may proceed with the channel setting procedure with another applied channel setting value chosen from among the remaining available channel setting values. On the other hand, if the applied channel setting value is the last one, the one-touch channel setting procedure may be ended.

As such, in this embodiment, the number of available channel setting values for which tuning is attempted (i.e. the number of applied channel setting values) may be relatively fewer than in the embodiment illustrated in FIG. 6.

This utilizes the principle that a DiSEqC switch has only one antenna setting per tuner. That is, in this embodiment, tuning attempts are not made for all other satellites that are included in combinations having the same tuner information as the DiSEqC switch input value already found.

With this embodiment also, a product having two or more tuners may utilize a procedure of setting channels in which the multiple tuners are tuned simultaneously using different available channel setting values.

Figure 8:
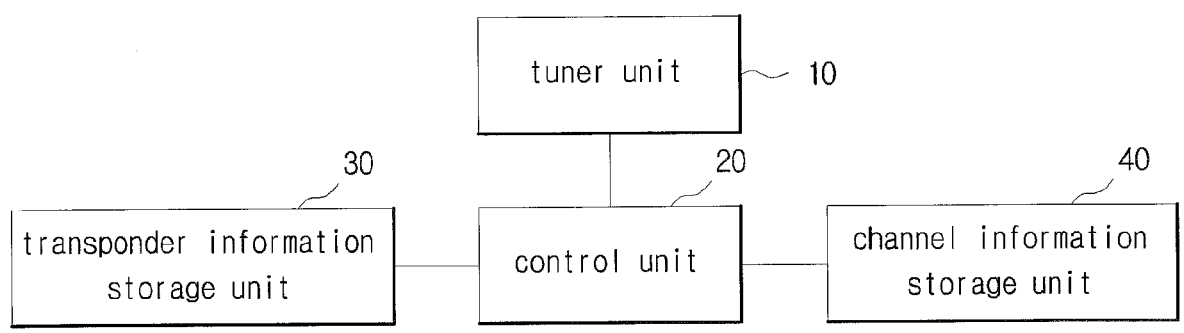
FIG. 8 is a block diagram illustrating a digital broadcast receiver according to an embodiment of the invention.

FIG. 8 is a block diagram illustrating a digital broadcast receiver according to an embodiment of the invention.

As illustrated in FIG. 8, a digital broadcast receiver according to this embodiment may include a tuner unit 10, a control unit 20, a transponder information storage unit 30, and a channel information storage unit 40.

A high-frequency signal inputted from the antenna may be received by the tuner unit 10 as a signal converted by the LNB, at which the tuner unit 10 may extract video and audio signals, etc., and transmit the extracted signals to a television, etc.

The control unit 20 may operate when there is a channel setting request inputted from a user, or according to a preconfigured period, to reference a transponder list corresponding to available channel setting values that can be combined using channel setting factors and tune the tuner corresponding to the applied channel setting value.

Also, the control unit 20 may control the overall operation of the digital broadcast receiver. For example, if tuning is successful in each tuner, the control unit 20 may check whether or not the tuned signal of the transponder from the transponder list matches the pre-stored signal information corresponding to the satellite, and if the results indicate a match, may set the antenna and tuner to correspond with the chosen applied channel setting value.

The channel information storage unit 40 may read and process the PSI/SI of the transponder signal which results in successful tuning for a tuner, to form and store as channel information. The channel information storage unit 40 may be implemented for example as a memory device, such as RAM, flash memory, and a hard disk, etc.

The transponder information storage unit 30 may be a storage device for storing the information of satellites connected to the digital broadcast receiver, the transponder lists of these satellites, and each of the transponder information. Here, the transponder list of a satellite and each of the transponder information may be pre-stored in the digital broadcast receiver, for example, using any one of a number of techniques know to those skilled in the art, and in which satellite information is updated.

As presented above, certain aspects of the invention can automate the procedures of setting the antenna and selecting the tuner in searching channels. That is, a user can complete a channel setting procedure by inputting a command just once, and this one-touch method of channel setting can thus increase user convenience.

Also, with certain aspects of the invention, the procedures of setting the antenna and tuner can be performed automatically, so that a user can be saved effort and costs when first installing the digital broadcast receiver or changing channels, and can select and receive the desired broadcast channels quickly and efficiently.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A one-touch channel setting method enabling channel setting in a digital broadcast receiver, the method comprising:
   (a) tuning a tuner corresponding to an applied channel setting value chosen from available channel setting values based on combinations of channel setting value factors by referencing a transponder list corresponding to the applied channel setting value; and
   (b) setting an antenna and a tuner to correspond with the applied channel setting value in accordance with a tuning result, wherein:
   one or more of the available channel setting values are produced to correspond to channel setting value factors that include satellite information, LNB information, a DiSEqC switch value and a factor indicating whether or not 22 KHz tone is used, and tuner information,
   operation (a) is repeated for a number of all possible combinations of the available channel setting values, and
   the number of all possible combinations is calculated by multiplying a number of satellite information, a number of LNB information, a number of DiSEqC switch values, a number of possible cases on whether or not 22 KHz tone is used, and a number of tuners.

2. The method of claim 1, wherein the operation (b) comprises proceeding again to the operation (a) with the chosen applied channel setting value removed, if the tuning is unsuccessful.

3. The method of claim 1 wherein, if any one combination of antenna and tuner is set, other channel setting values having same tuner information and DiSEqC switch input value as those of the set available channel setting value are excluded from the operation (a).

4. The method of claim 1, wherein, if the digital broadcast receiver has a plurality of tuners, each tuner is tuned simultaneously in the operation (a) using a different applied channel setting value.

5. The digital broadcast receiver of claim 1, wherein operation (b) comprises:
   determining, if the tuning is successful, whether or not the tuned signal of a transponder from the transponder list matches pre-stored signal information of a transponder corresponding to the satellite; and
   setting the antenna and the tuner to correspond with the applied channel setting value if a result of the determination indicates a match, and performing operation (a) again with the chosen applied setting removed if there is no match.

6. The method of claim 5, wherein the determining is performed by comparing PSI/SI data of the stored transponder signal information and the signal of the transponder.

7. The method of claim 6, wherein the PSI/SI data of the stored transponder signal information and the signal of the transponder are pre-stored in the digital broadcast receiver.

8. A digital broadcast receiver comprising:
   a tuner unit having one or more tuners and configured to tune a signal inputted from an antenna;
   a controller configured to tune a tuner corresponding to an applied channel setting value chosen from available channel setting values based on combinations of channel setting value factors by referencing a transponder list corresponding to the applied channel setting value, and configured to set an antenna and a tuner to correspond with the applied channel setting value in accordance with a tuning result; and a channel information storage area configured to store channel information based on a processed signal of a transponder tuned by the tuner, wherein:

one or more of the available channel setting values are produced to correspond to channel setting value factors that include satellite information, LNB information, a DiSEqC switch value and a factor indicating whether or not 22 KHz tone is used, and tuner information, the controller attempts to tune the tuner repeatedly for a number of all possible combinations of the available channel setting values, and the number of all possible combinations is calculated by multiplying a number of satellite information, a number of LNB information, a number of DiSEqC switch values, a number of possible cases on whether or not 22 KHz tone is used, and a number of tuners.

9. The digital broadcast receiver of claim 8, wherein, if any one combination of antenna and tuner is set, other channel setting values having same tuner information and DiSEqC switch input value as those of the set available channel setting value are excluded from channel setting.

10. The digital broadcast receiver of claim 8, wherein the controller determines whether or not the tuned signal of a transponder from the transponder list matches pre-stored signal information of a transponder corresponding to the satellite, wherein the determining is performed by comparing PSI/SI data of the stored transponder signal information and the signal of the transponder.

11. The digital broadcast receiver of claim 10, further comprising a transponder information storage area to store the PSI/SI data of the signal of the transponder and the transponder list.

12. The digital broadcast receiver of claim 8, wherein, if the digital broadcast receiver has a plurality of tuners, each tuner is tuned simultaneously in the tuning using a different applied channel setting value.

13. The digital broadcast receiver of claim 8, wherein the controller is to:

determine, if the tuning is successful, whether or not the tuned signal of a transponder from the transponder list matches pre-stored signal information of a transponder corresponding to the satellite, set the antenna and the tuner to correspond with the applied channel setting value if a result of the determination indicates a match, and repeating a channel setting procedure with the chosen applied setting removed if there is no match.

\* \* \* \* \*